(12) United States Patent
Dip et al.

(10) Patent No.: US 7,022,192 B2
(45) Date of Patent: Apr. 4, 2006

(54) SEMICONDUCTOR WAFER SUSCEPTOR

(75) Inventors: Anthony Dip, Cedar Creek, TX (US);
Takanori Saito, Kanagawa (JP);
Raymond Joe, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 161 days.

(21) Appl. No.: 10/233,483

(22) Filed: Sep. 4, 2002

(65) Prior Publication Data

US 2004/0040510 A1 Mar. 4, 2004

(51) Int. Cl.
*H01L 21/00* (2006.01)
*C23C 16/00* (2006.01)

(52) U.S. Cl. .................. 118/725; 118/728; 206/832; 219/444.1; 219/544; 392/416; 392/418; 156/345.51

(58) Field of Classification Search ................ 118/725, 118/728; 206/832; 219/444.1, 544; 392/416, 392/418; 156/345.51
See application file for complete search history.

(56) References Cited

U.S. PATENT DOCUMENTS

| | | | | |
|---|---|---|---|---|
| 3,860,737 A | * | 1/1975 | Moscatello ................ 219/634 |
| 4,950,870 A | | 8/1990 | Mitsuhashi et al. ......... 219/390 |
| 5,162,047 A | | 11/1992 | Wada et al. ............... 29/25.01 |
| 5,242,501 A | * | 9/1993 | McDiarmid ................ 118/728 |
| 5,310,339 A | | 5/1994 | Ushikawa ................. 432/253 |
| 5,325,265 A | * | 6/1994 | Turlik et al. ............... 361/702 |
| 5,458,688 A | | 10/1995 | Watanabe |
| 5,562,387 A | | 10/1996 | Ishii et al. ................. 414/416 |
| 5,586,880 A | | 12/1996 | Ohsawa ...................... 432/241 |
| 5,618,351 A | | 4/1997 | Koble, Jr. et al. ......... 118/728 |
| 5,626,456 A | | 5/1997 | Nishi ......................... 414/404 |
| 5,775,889 A | | 7/1998 | Kobayashi et al. .......... 432/18 |
| 5,810,538 A | | 9/1998 | Ozawa et al. .............. 414/217 |
| 5,813,851 A | | 9/1998 | Nakao .......................... 432/6 |
| 5,820,366 A | | 10/1998 | Lee ............................ 432/241 |

(Continued)

FOREIGN PATENT DOCUMENTS

| | | | |
|---|---|---|---|
| JP | 56126928 A | * | 10/1981 |
| JP | 06-260438 | | 9/1994 |
| JP | 08008198 A | * | 1/1996 |
| JP | 09-050967 | | 2/1997 |
| JP | 09-199437 | | 7/1997 |
| JP | 09-199438 | | 7/1997 |
| JP | 10-050626 | | 2/1998 |
| JP | 10-2884429 | | 10/1998 |
| JP | 11-026561 | | 1/1999 |
| JP | 11-243064 | | 9/1999 |
| JP | 2000243813 A | * | 9/2000 |
| JP | 2001358086 A | * | 12/2001 |

OTHER PUBLICATIONS

Patent Abstract of Japan for 52–143455, dated Nov. 30, 1977.
Patent Abstract of Japan for 04317701, dated Nov. 2, 1977.
Patent Abstract of Japan for 06–072628, dated Mar. 15, 1994.
Patent Abstract of Japan for 06–163440, dated Jun. 10, 1994.
Patent Abstract of Japan for 07–045691, dated Feb. 14, 1995.

(Continued)

*Primary Examiner*—Parviz Hassanzadeh
*Assistant Examiner*—Ram N Kackar
(74) *Attorney, Agent, or Firm*—Smith, Gambrell & Russell, LLP (57) ABSTRACT

A semiconductor wafer susceptor for batch substrate processing. The susceptor includes a central region in a primary plane and a plurality of flat annular extensions extending below the central region in a secondary plane. The primary and secondary planes are parallel to each other. An edge of the substrate overhangs the central region allowing no contact of the susceptor with the substrate edge.

17 Claims, 13 Drawing Sheets

METHOD OF OPERATION

U.S. PATENT DOCUMENTS

| | | | |
|---|---|---|---|
| 5,865,321 A | 2/1999 | Tomanovich | |
| 5,961,323 A | 10/1999 | Lee | 432/241 |
| 5,968,593 A | 10/1999 | Sakamoto et al. | 427/248 |
| 6,086,680 A * | 7/2000 | Foster et al. | 118/725 |
| 6,634,882 B1 * | 10/2003 | Goodman | 432/253 |

OTHER PUBLICATIONS

Patent Abstract of Japan for 08–277297, dated Oct. 22, 1996.

Patent Abstract of Japan for 09–044142, dated Feb. 14, 1997.

Patent Abstract of Japan for 07–266531, dated Sep. 20, 1995.

Patent Abstract of Japan for 09–197023, dated Jul. 31, 1997.

Patent Abstract of Japan for 09–205373, dated Jul. 15, 1997.

Patent Abstract of Japan for 09–211455, dated Aug. 6, 1997.

EP Patent Abstract for 08–43338, dated May 20, 1998.

Patent Abstract of Japan for 11–032369, dated Feb. 10, 1999.

* cited by examiner

INDUSTRY STANDARD SUPPORT METHOD

RING SUPPORT METHOD(S)

BAND SUPPORT METHOD

OPTIMAL SUPPORT METHODS

THERMAL GRADIENT DUE TO WAFER STACKING

NEW SUPPORT METHOD

EXPECTED REDUCTION OF WiW ΔT

MODIFIED NEW SUPPORT METHOD

SEMICONDUCTOR WAFER SUSCEPTOR

BACKGROUND OF THE INVENTION

This invention relates to semiconductor wafer processing, and more particularly to a semiconductor wafer susceptor which can be used in batch processing of semiconductor substrates.

For common semiconductor films such as silicon nitride, polysilicon, and thermal oxides, substrate processing usually proceeds by elevating the substrate to some process temperature, conducting the process, and finally cooling the substrate. Generally, most processes are conducted in a 200 mm batch furnace where substrates (hereafter referred to as wafers) are placed in a vertically stacked arrangement. Because of process and throughput requirements, the wafer stack often undergoes rapid heating and cooling at the beginning and end of the process. However, some thermal ramping limits exist at higher processing temperatures. It is now known that for 300 mm wafer, serious limitations exist on wafer heating/cooling rates and maximum process temperatures, well below the operational limits of the processing equipment.

The gravitational force and elevated process temperature (typically above 850° C.) cause considerable stress on the silica on a wafer, leading to situations where slip and plastic deformation may occur. Fast thermal ramping can further degrade the situation because within-wafer (WinW) thermal gradients from uneven heating of wafers in a vertical stacked arrangement may cause slip to occur even before the process temperature is reached. Of course, fast thermal ramping is employed to increase productivity by decreasing the overall cycle time or reduce thermal budget by decreasing the ramping cycles. Therefore, a serious situation arises for high temperature processing of 300 mm substrate, especially in batch processing environments. Additionally, even if slip does not occur, the induced thermal gradient on the wafer may be of sufficient magnitude as to cause significant differences in the thermal histories of the die spread across the wafer. This will result in an unexpected die performance variation between the wafer center and edge locations.

Two approaches can be taken to solve this slip problem. One approach is to improve the wafer's chemical and mechanical characteristics, such as decreasing the oxygen precipitate concentration within the silicon wafer. This approach is an area of responsibility for the wafer manufacturers. The other approach is to improve the substrate support design.

Figure 1A:
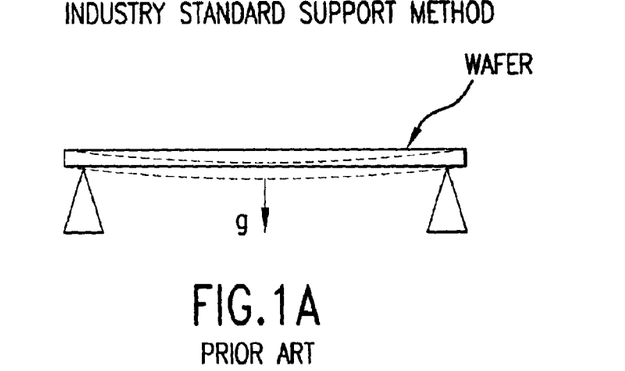
Figure 1B:
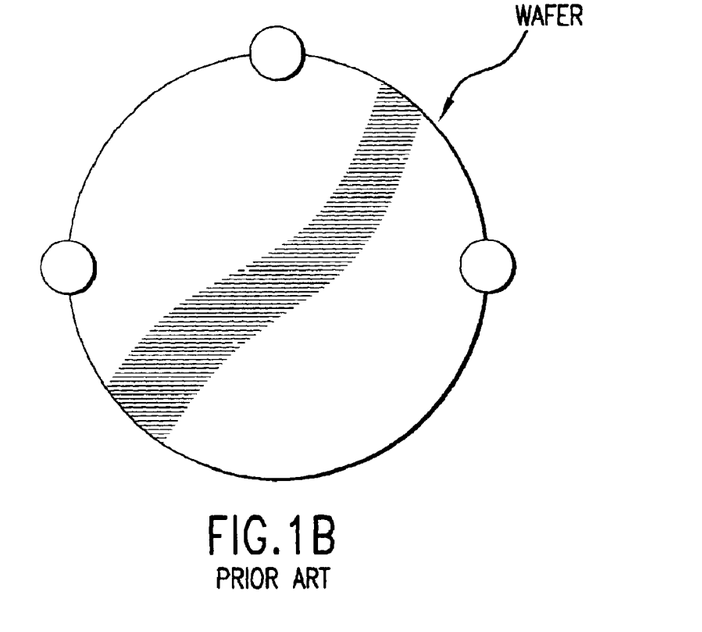
Figure 1C:
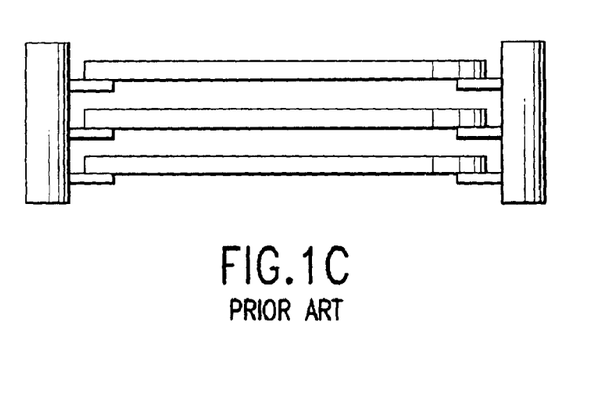

The current industry standard for vertical batch wafer processing is the ladder boat and its variations (FIG. 1). This is the simplest design for vertical batch processing. However, it does not provide the most optimum mechanical support possible with respect to gravitational forces. Also, the standard ladder boat provides little reduction in thermal gradients. The ladder boat's greatest advantages are its low cost and compatibility with standard automation.

Figure 2A:
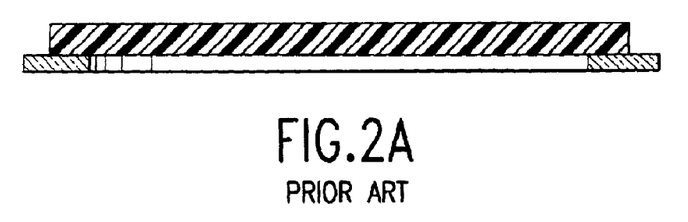
Figure 2B:
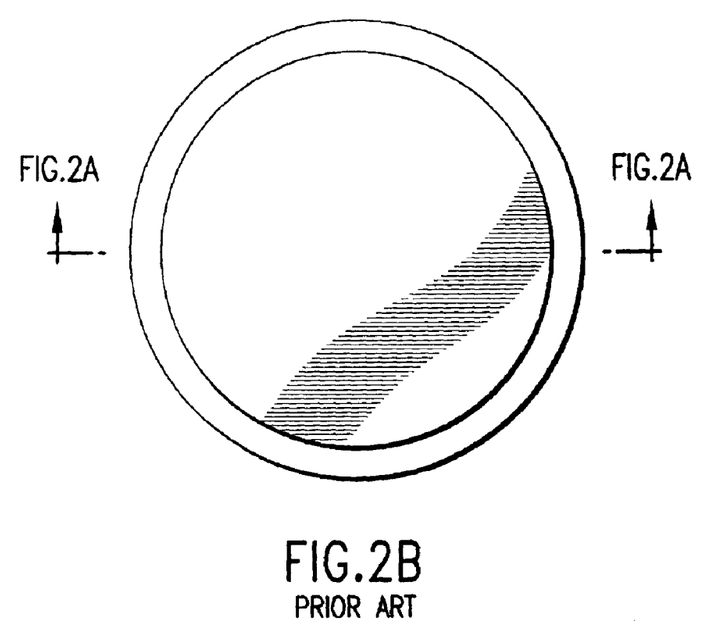
Figure 2C:
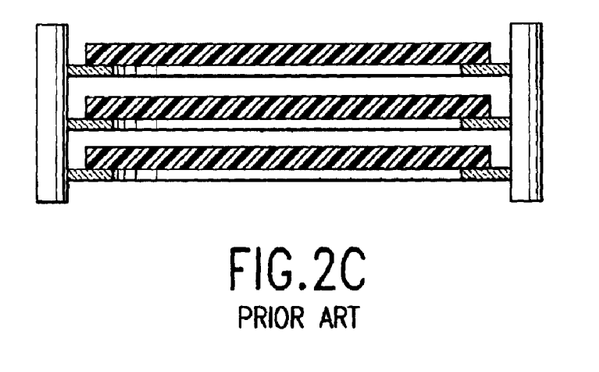

Two previously developed innovations have addressed the WinW wafer thermal issue for batch processing. The first wafer support method, shown in FIG. 2, was developed and patented by Tokyo Electron Ltd. (TEL). This "ring" support method uses a ring of material (typically quartz) designed to come into physical contact with the edge of the wafer. The addition of mass near or at the wafer's edge reduces the WinW thermal gradient because of the increase in heat capacity and change in radiation view factors. The method also provides a larger area of mechanical support than a ladder boat. The method gives good performance on 200 mm wafers, as thermal WinW gradients are controlled to under 10° C. for fast thermal ramps (above 75° C./min). However, this support method is complex and such designs are more expensive to manufacture and purchase. Additionally, this method requires more complex automation to load and unload wafers from the support appliance, leading to added cost for the associated support automation.

Figure 3A:
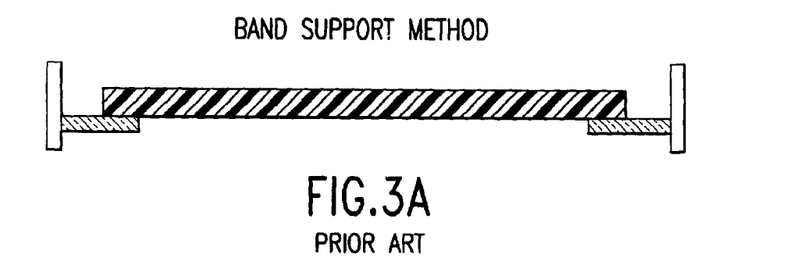
Figure 3B:
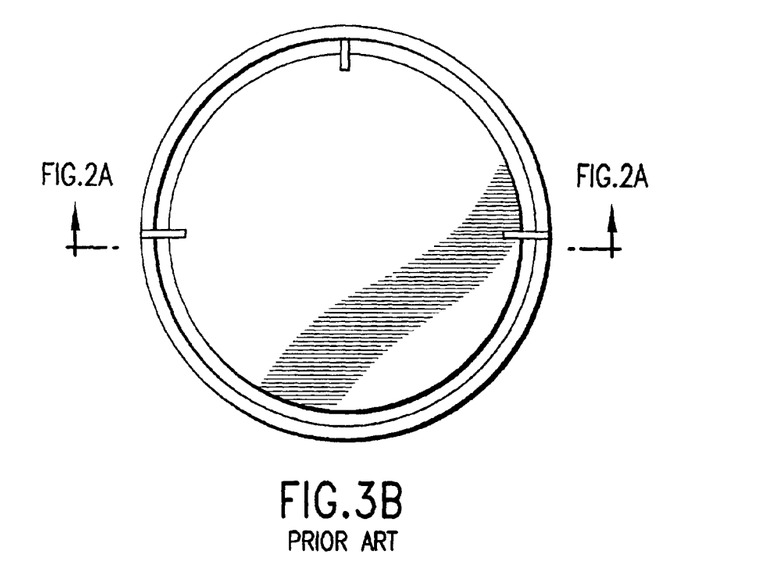
Figure 3C:
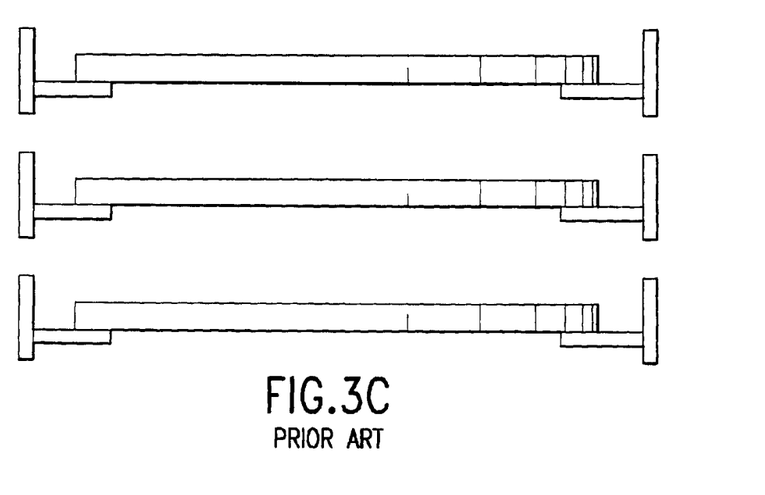

Another approach found in the prior art (previously patented by SVG, Thermco Systems) is the "band" method as shown in FIG. 3. Here, a thin band of material, typically quartz, is placed around the edge of the wafer, but not in intimate contact. The quartz material is either opaque or mechanically modified to be translucent. This method, like the ring support, reduces or screens incident radiation onto the wafer's edge, while permitting radiation through the unblocked areas and onto the wafer's center. Although not as effective as the ring support method shown in FIG. 2, the "band" method does reduce WinW thermal gradients and can be manufactured at a lower cost.

Figure 4A:
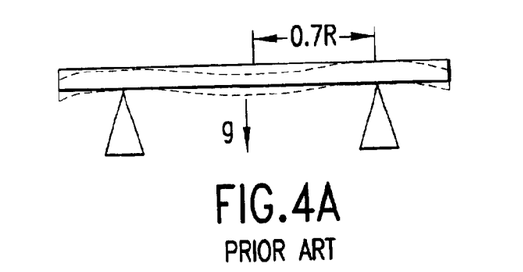

Other approaches to wafer support methodologies have been previously explored by others and are well known within the industry. In FIG. 4A, the best theoretical point contact support at a single radius value is shown. This method places point supports at 70% of the radial distance from the center to the wafer's edge, to balance the weight of the wafer on either side of the support and reduce gravitational stress effects. This approach when implemented in a ladder boat configuration will provide better support, but the cost will be greater due to the additional manufacturing complexity of very long support tabs. Also, this method does not address the WinW thermal gradient problem. A corresponding analogy exists for the ring support (point contact) where the location for a single ring would be also at 70% of the radial distance from the center to the wafer's edge. In this case, the ring support's axial symmetry greatly improves the control of the gravitational stress magnitude and symmetry compared to the ladder boat method. FIG. 4C shows the absolute best theoretical support design possible, as all points on the wafer are mechanically supported. Clean, simple, and efficient mechanical wafer loading and unloading for this design becomes a serious problem, if not impossible, with current automation technology.

Figure 4B:
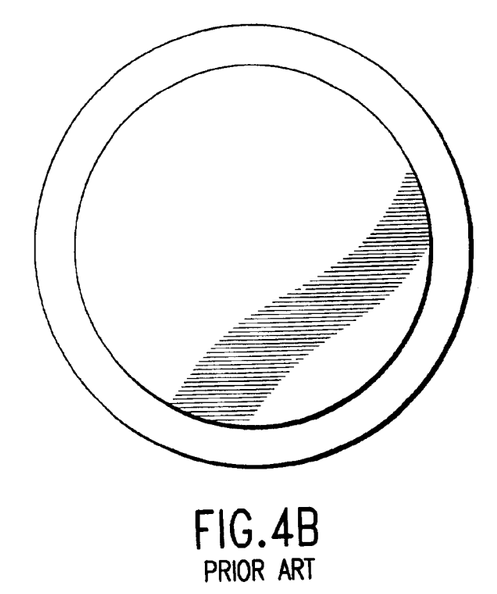
Figure 4C:
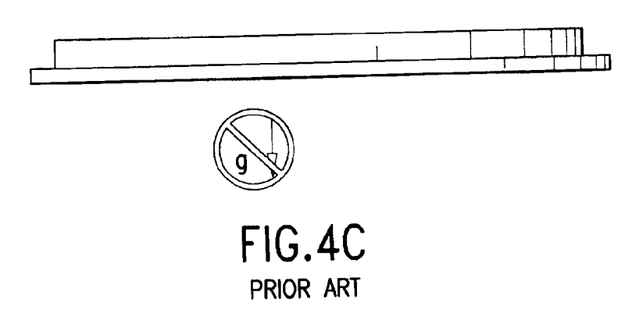

The vast majority of single wafer processing equipment currently use supports shown in FIGS. 4B and 4C. Here either a ring of material or a flat plate or susceptor composed of quartz, SiC or similar material supports the wafer. These designs are preferred for reasons of simplicity or reduction of thermal mass to permit rapid wafer heating and cooling (up to 100° C./sec). The supports in FIGS. 4B and 4C are not necessarily employed for thermal WinW control in single wafer processing equipment because they rely on heating element design to accomplish WinW thermal uniformity. In some cases, there may be some benefit based on material selection with reducing thermal non-uniformity. As an added benefit, gravitational forces are reduced and in the case of FIG. 4C, are completely eliminated if the right support material is used. However, these designs do add complexity to the method of wafer handling and are best suited for single wafer environments where the automation comprises a larger percentage of the overall equipment set and cost.

WinW Thermal Gradients

Figure 5A:
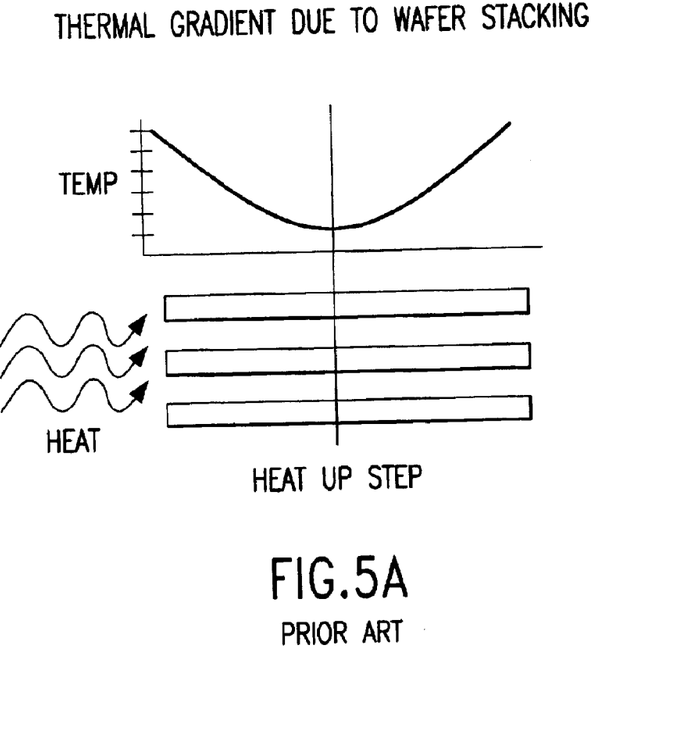
FIG. 5 is an illustration of the within-wafer thermal gradients during heating and cooling of the substrates.
Figure 5B:
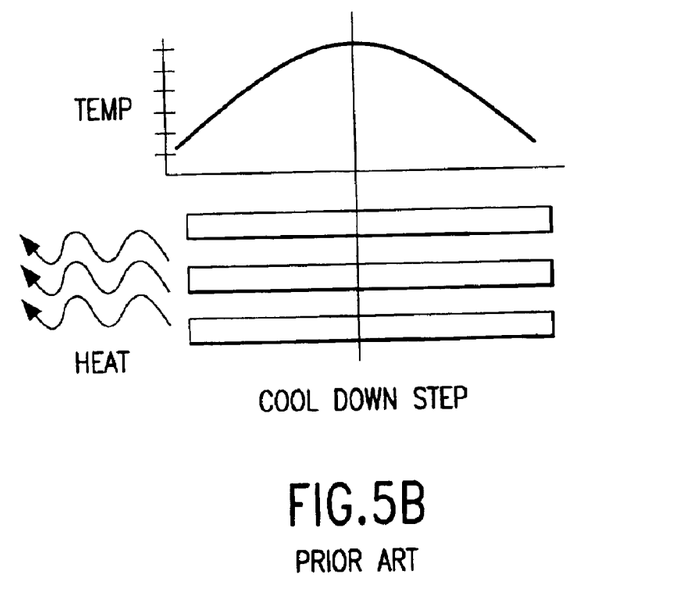

The primary issue with batch processing and rapid heating of large substrates is the resultant thermal gradients, as demonstrated in FIG. 5. During the heating phase of the process cycle (see FIG. 5A), the edges of the wafer receive the majority of the incident radiation and as a result heat up at a faster rate. Heating of the interior regions of the wafer is chiefly accomplished by thermal conduction through the substrate itself. As a result, a "bowl"-shaped thermal profile forms across the wafer. This thermal gradient can add to the gravitational stress and—if large enough—cause warping, bowing, plastic deformation, and slip to occur. A solution to this problem would be to increase the pitch of the wafer stack, thereby increasing the radiation view factor for the wafer center.

As in the case for heating, rapid cooling of the wafer (see FIG. 5B) can also have negative effects. Efficient radiative cooling of the wafer's edge occurs because of a large exposed area (large angular exposure to the heater walls) at the wafer's edge. The interior regions of the wafer have smaller exposed angular area to the outside and thus cool inefficiently through radiation. The central region of the wafer mainly cools through thermal conduction from the wafer center to the edge where then energy is more effectively radiated away. As a result, a "dome"-like thermal gradient is formed across the wafer. This thermal gradient can add to the gravitational stress and—if large enough—cause warping, bowing, plastic deformation, and slip to occur. Like heating, a solution would be to increase the radiation view factor for the wafer center.

Figure 6:
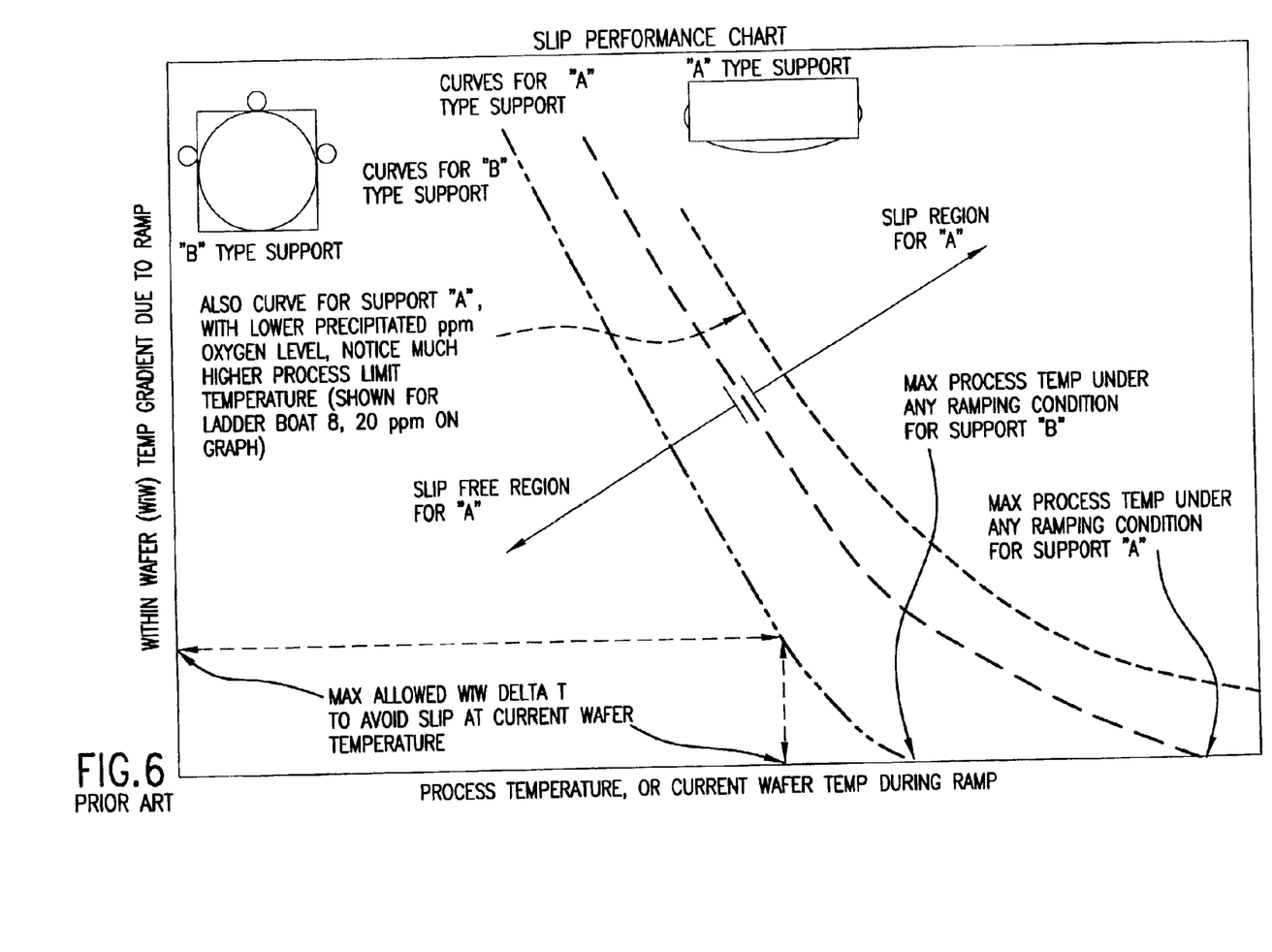
FIG. 6 illustrates slip curves for ladder-type boat (3 point support) and ring boat (point contact support)

Given a particular support design, the magnitude of this WinW thermal gradient coupled with the process temperature determines whether slip conditions exist. FIG. 6 shows the difference in slip curves between a ladder-type and a ring boat. For a given WinW thermal gradient and process temperature, the wafer will tend to exhibit slip if the process condition lies on the right-hand side of the slip curve. FIG. 6 shows that the maximum allowable delta T decreases rapidly with increasing wafer edge temperature.

Figure 7:
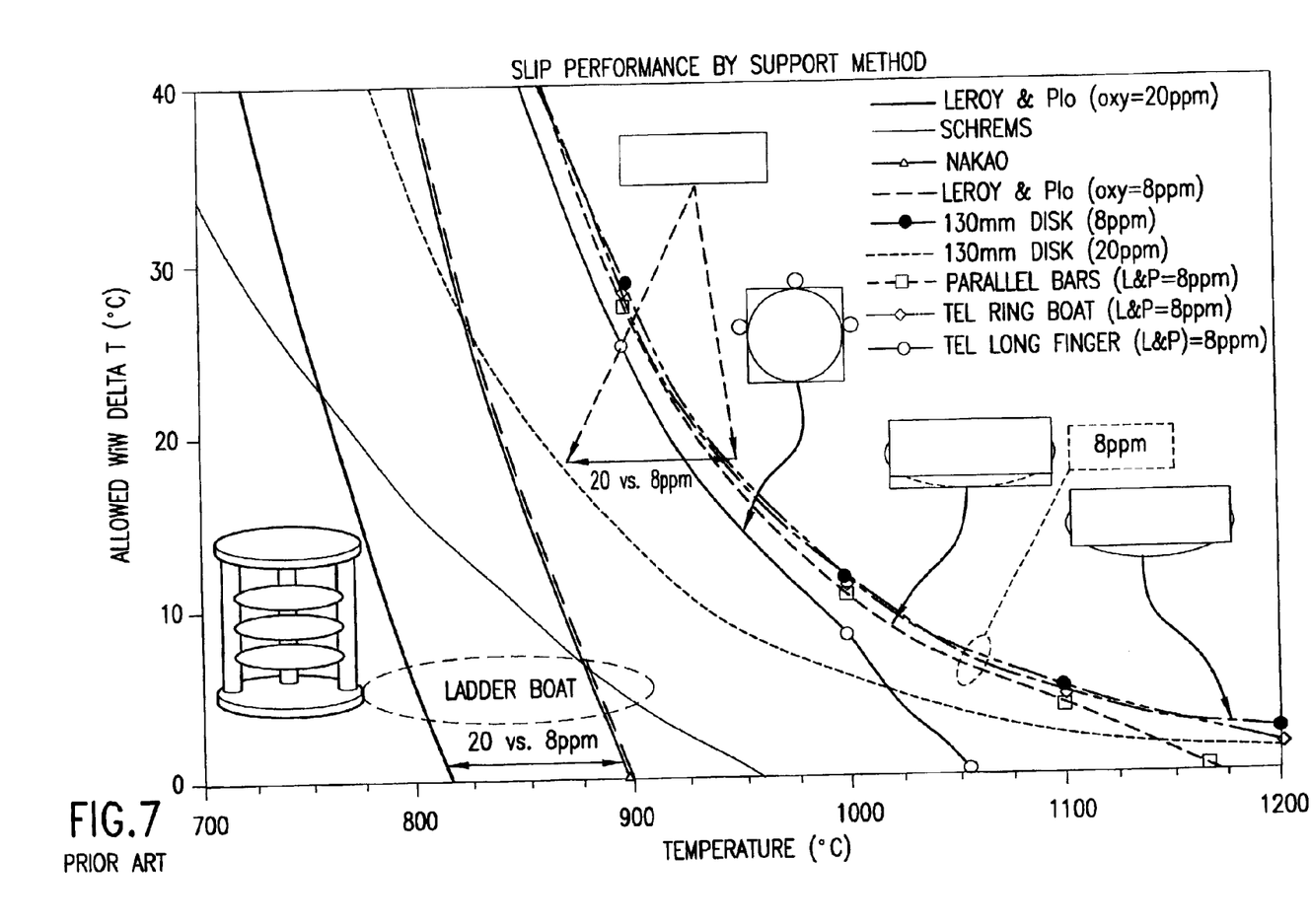
FIG. 7 is a slip performance by support method chart.

As seen in FIG. 7, the ladder boat (3 point support) would not be sufficient for processes requiring temperatures above 850° C., as slip and possible plastic deformation would occur. Increasing the number of point supports for a ladder boat or decreasing the oxygen precipitate concentration would help. Increasing the number of point supports and relocating them to the optimum locations would shift the slip curve to the right and permit a larger allowable WinW thermal gradient the processing temperature. The disk and ring supports lie near the limit for such improvements. The ring boat (ring support) would be adequate for the high temperature processes, but the complexity of wafer automation would be a disadvantage.

SUMMARY OF THE INVENTION

Figure 8A:
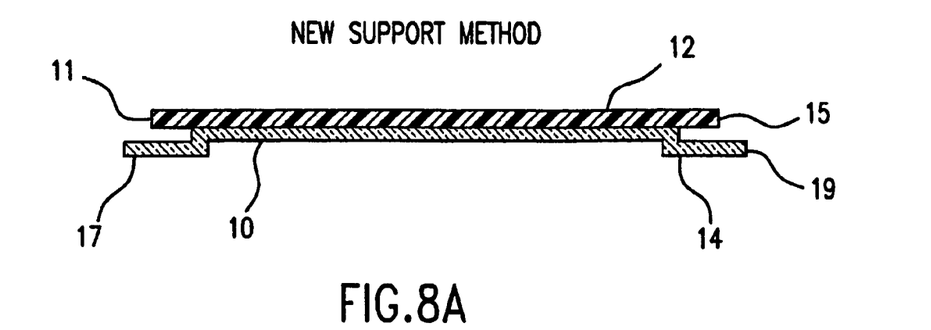
FIG. 8 is a wafer support design of the claimed invention.
Figure 8B:
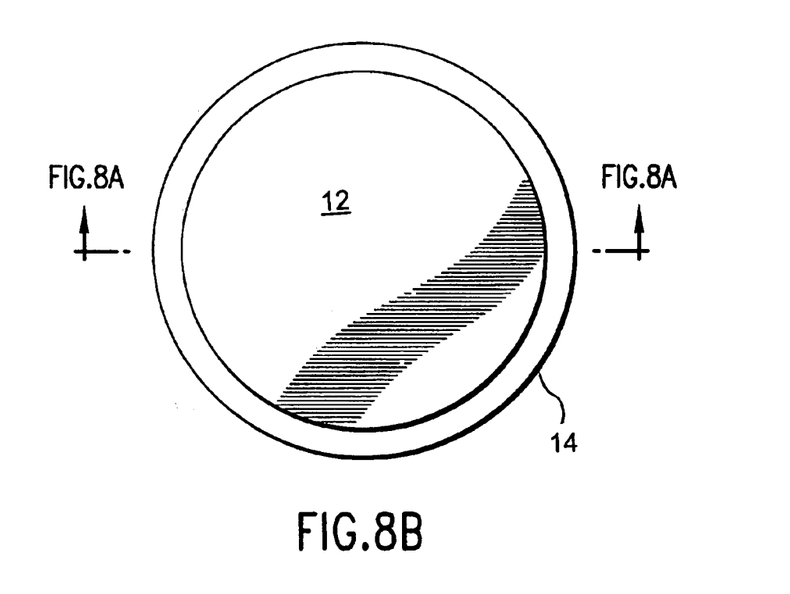
Figure 8C:
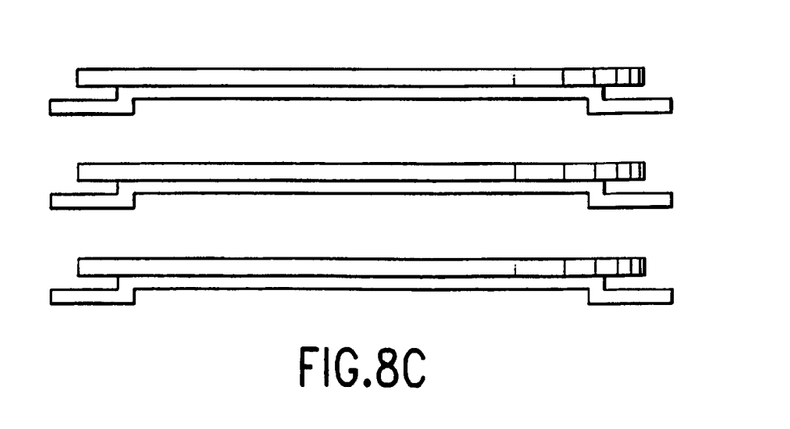

The present invention relates to a semiconductor wafer susceptor that is used in supporting substrates in batch processing. In FIG. 8, the approach suggested is to provide a susceptor design that is generally flat and makes contact with the majority of the wafer as to eliminate the gravitational stress component. The new susceptor design is thin in cross section, on the order of the wafer thickness itself (~750 microns) and thus adds minimal mass to the thermal load. The susceptor is composed of a material or composite with a higher thermal conductivity than Si, such as SiC. It mostly resembles a flattened "top hat" in shape, extends beyond the edge 11 of the wafer 12, and has two planes, a primary plane 13 and a secondary plane 15, or primary flat surfaces, thus the name extended bi-planar susceptor.

Figure 9A:
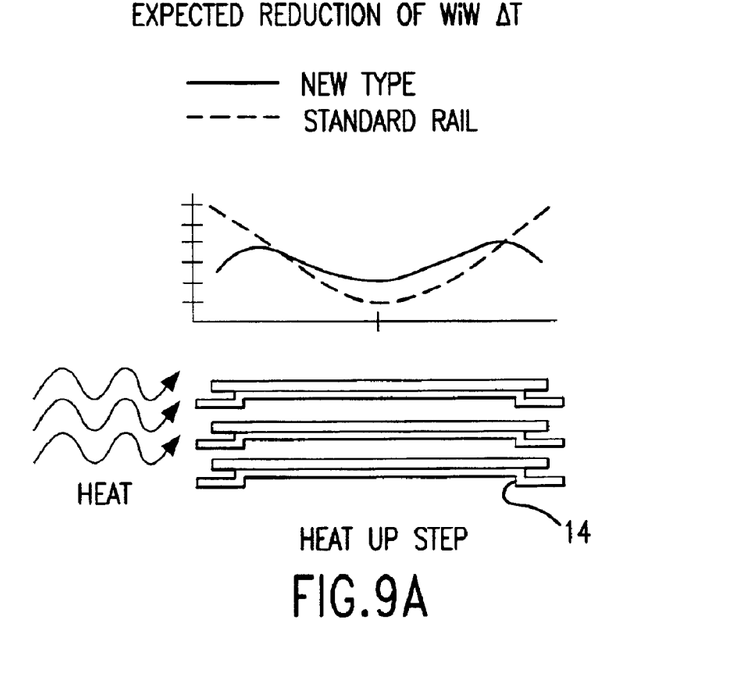
FIG. 9 illustrates expected improvement in within-wafer thermal gradient.
Figure 9B:
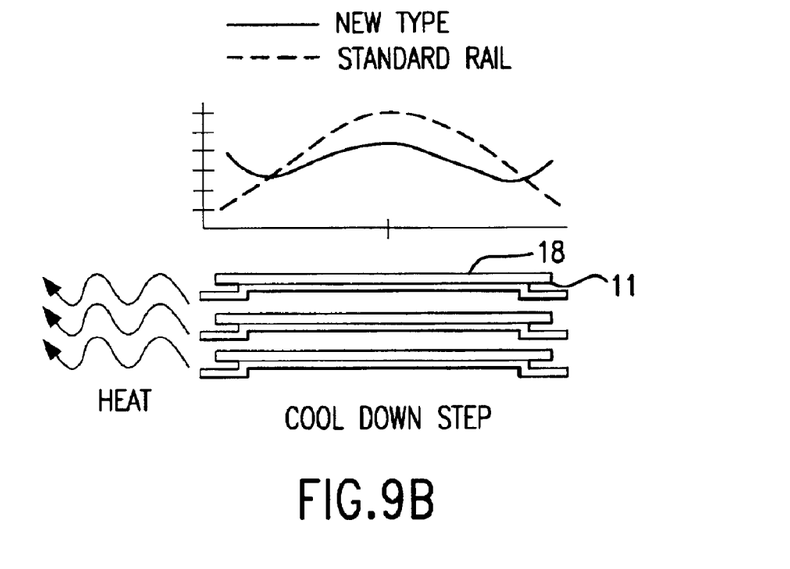
Figure 10:
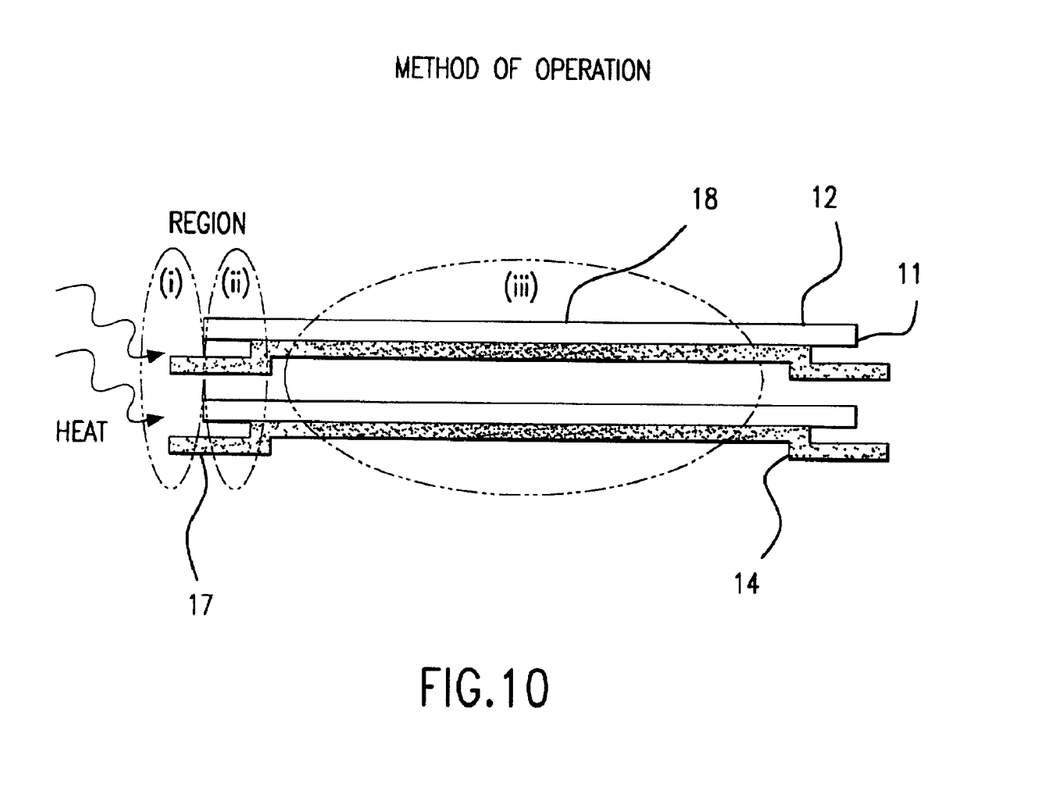
FIG. 10, key regions of heat transfer for the claimed invention.

Another feature of the bi-planar shape is that the edge 14 of the susceptor 10 is not in intimate contact with the edge 11 of the wafer 12. Also, the edge of the susceptor extends beyond that of the wafer. This design feature is best explained as follows, refer to FIGS. 9 and 10 for graphical illustrations of discussion below.

BRIEF DESCRIPTION OF THE DRAWINGS

The various advantages of the present invention will become apparent to one skilled in the art by reading the following specification and subjoined claims and by referencing the following drawings in which:

FIG. 1 is an industry standard for wafer support, the three rail vertical ladder boat, (A) cross-section showing the effect of gravity, (B) top view, and (C) vertical stack arrangement;

FIG. 2 is a ring boat: a ring supports the wafer along and near the wafer's edge, (A) cross-section, (B) top view, and (C) vertical stack arrangement;

FIG. 3 is a band support design which places an opaque quartz band near the wafer's edge, (A) cross section, (B) top view, and (C) vertical stack arrangement;

FIG. 4 is an optimal support design, (A) best support method, (B) support ring used on some single wafer systems, (C) flat susceptor design used on some single wafer systems;

DETAILED DESCRIPTION OF THE INVENTION

In FIG. 8, a semiconductor wafer susceptor 10 is shown with a substrate wafer 12 placed on top. The design is such that an edge 14 of the susceptor 10 is not in contact with the wafer 12. This permits the susceptor 10 to collect 50% (or more) of the radiation incident at the wafer's edge 11 without transmitting the energy directly to the wafer's edge 11. With respect to FIG. 10 also, instead, the energy collected in Region I and Region II which includes a plurality of flat annular extensions 17 in secondary plane 19, is carried away from the wafer's edge 11 and transferred through conduction into Region III, a flat circular central region 18 situated in primary plane 15. There, this additional thermal energy is distributed through improved thermal conduction of the susceptor material across the central region 18 of the wafer 12. The amount of collection is strongly modulated by the length of Region I beyond the wafer's edge 11. The point at which the collected thermal energy is first injected in the wafer 12 is determined by the Region II/III interface.

Figure 11:
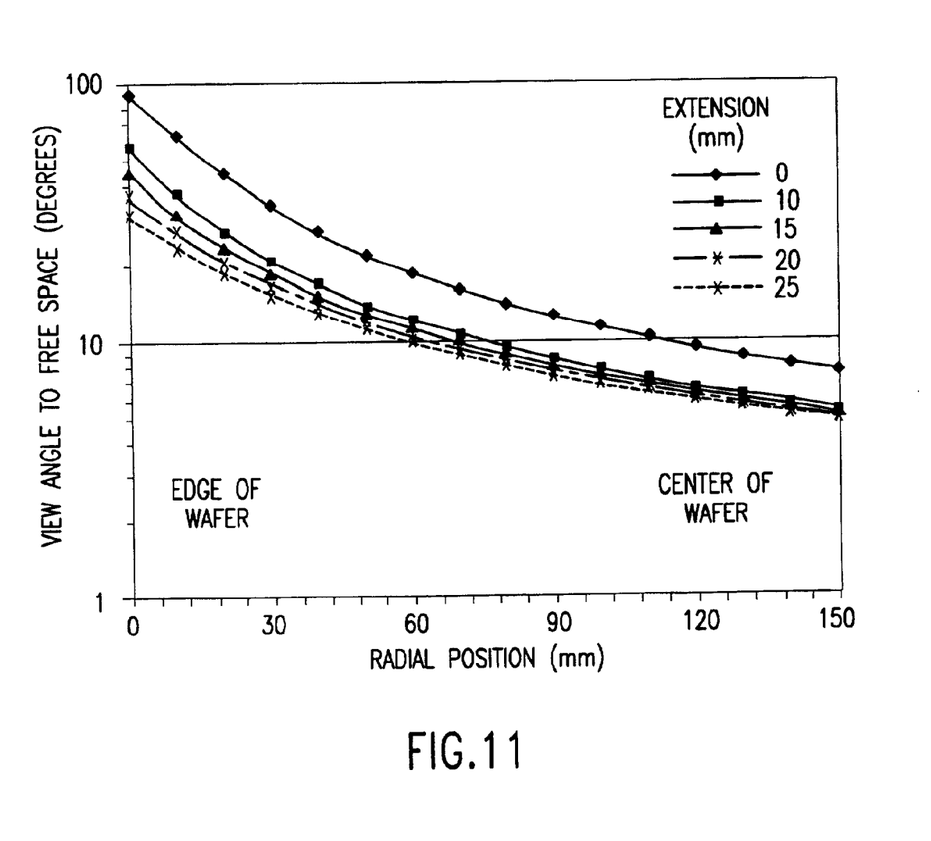
FIG. 11 illustrates calculated view angles for radial positions using the design of the claimed invention.

The susceptor 10 contacts the majority of the wafer 12 at central region 18, a distribution plate. This region 18 provides the best mechanical support possible for the majority of the wafer 12 (a generally flat plate), thus eliminating virtually all effects from gravitational stress. Also, since the susceptor material is of a higher thermal conductivity than Si, the heat distribution in Region III (central region 18) which is mainly controlled by conduction, proceeds more uniformly further reducing thermal gradients across the wafer. As can be seen by examination of FIG. 11, the view angle to the heating device along the radial direction varies over one order of magnitude. At a point of about 60 mm from the edge 11 of the substrate 12 (for a 300 mm wafer), the view angle is approximately one-fifth of that near the edge, implying that at least one-fifth of the integrated radiation will be incident at a point 60 mm away from the edge 11 as compared at the wafer's edge 11.

Cooling Considerations for Regions I, II and III

Cooling progresses much in the same way as heating only in reverse. Energy is primarily carried away from central region 18 (Region III) (mainly by conduction) to Regions I and II where it radiates into space from the plurality of flat annular extensions 17. Since the means exists to transfer energy out from Region III more efficiently than in the ladder boat case, the thermal gradient will be reduced.

Advantages of this susceptor design are:

Compatible with current automation designs

Reduces thermal gradients through better heat energy conduction (wafer center) and screening of radiation (wafer edge)

Figure 12A:
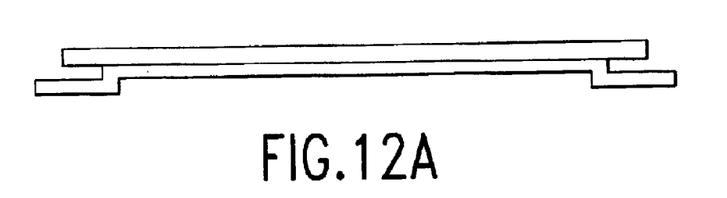
FIG. 12, an alternative embodiment of the claimed invention.
Figure 12B:
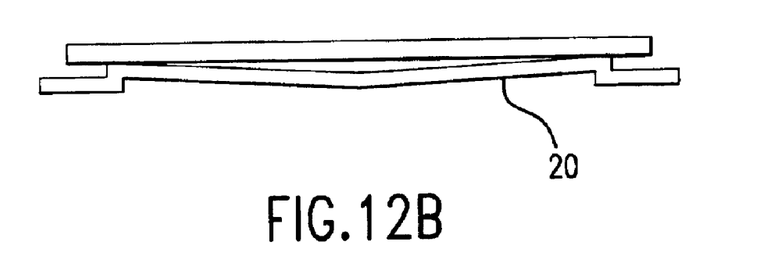
Figure 12C:
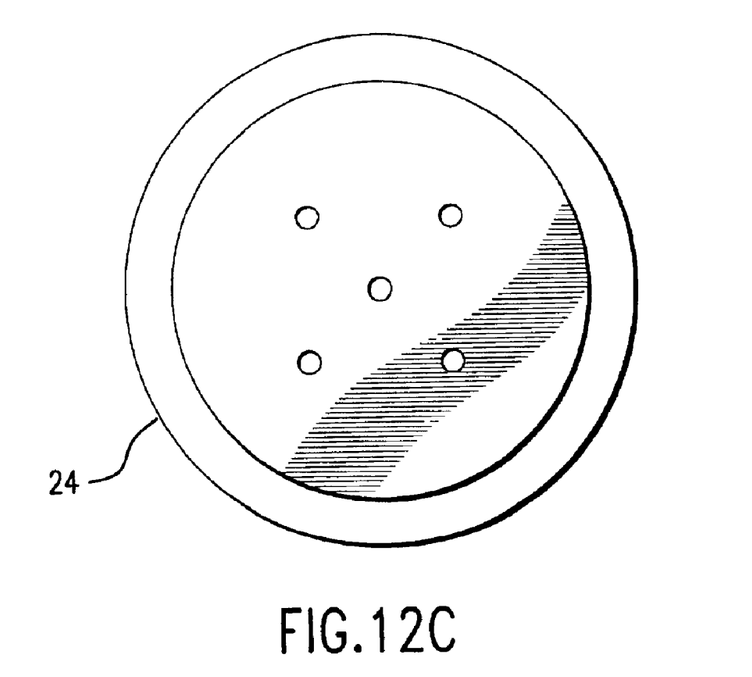
Figure 13:
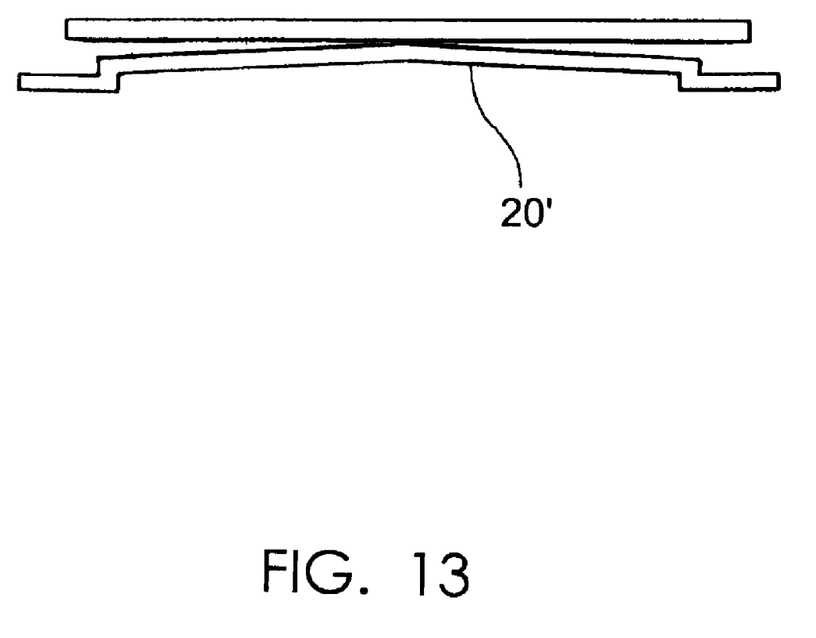
FIG. 13, another alternative embodiment of the claimed invention.

Provides almost ideal mechanical support, eliminates gravitational stresses from acting on the substrate Can be arranged in a stacked configuration using a modified ladder boat design Results in a total mass increase of the thermal load of about double that of the silicon wafer load by itself May be possible to use for low-pressure chemical vapor deposition (LPCVD) processing without any dummy wafer requirement to replace absent silicon wafers Possible to easily manufacture using low-pressure chemical vapor deposition (LPCVD) SiC technology Additional Considerations Optimal performance of the susceptor 10 may depend on additional modifications to the basic design. These are illustrated in FIGS. 12 and 13. The basic design is shown for reference in FIG. 8A. Modification of the main central region 18 by building a concave surface 20 (convex surface 20' in FIG. 13) may be beneficial for certain processing conditions and substrate types. Some conditions where this may be needed are processes that will result in some bowing of the wafer 12 due to film stress from the deposition process or from a pre-existing film on the substrate. By incorporating a slightly concave or convex surface into the susceptor 10 design, it may permit better physical contact between the substrate and the susceptor support under actual processing conditions.

Additionally, loading of the substrate may lead to undesired effects if a compressed air layer is allowed to form in the narrow gap between the substrate and the susceptor during the drop off step. If this condition were to occur, the substrate may drift from the desired placement position while floating on a thin blanket of air. Similarly, during the pick up step of the unloading operation, resistance to lifting is possible if good intimate contact exists between the substrate and the susceptor support. In this case, difficulty in lifting the substrate will occur as a partial vacuum will exist between the substrate and the susceptor. To reduce these air pressure effects, it is possible to incorporate a series of small perforations (holes) 24 throughout the central region 18 that will permit air to flow in and out of the region between the substrate 12 and the susceptor 10 with less resistance.

One particular variation of the claimed invention is the top hat design with the central region 18 of the susceptor 10 removed. That is, a significant central portion of Region III in the wafer support is removed. In this case, some diameter less than the full diameter of the upper wafer support is removed so that the wafer 12 is supported mainly along the outer edge of the wafer support top. Doing so creates an advantageous situation where the mass at the center of such assembly is roughly half of that in a top hat design. This translates to a faster thermal ramping and cooling due to the lower mass amount. Some degree of mechanical support is lost due to the removal of the wafer support at the center, however, depending on the amount of support removed.

In a preferred embodiment of the semiconductor wafer susceptor of the present invention, the susceptor is composed of silicon carbide, quartz, silicon, graphite, diamond-coated graphite, silicon-coated graphite, composites or metals. In this embodiment, the material constituting the susceptor preferably has a net composite thermal conductivity at least equal to a substrate placed on top of the susceptor.

The invention has been described with reference to an exemplary embodiment. This description is for the sake of example only, and the scope and spirit of the invention ought to be construed by appropriate interpretation of the appended claims.

What is claimed is:

1. A plurality of semiconductor wafer susceptors oriented to form a vertical boat for use in processing a plurality of substrates having a diameter of 200 mm or 300 mm, each of said susceptors comprising:

a flat circular central region situated in a primary plane, for supporting said substrate thereon, said circular central region having a diameter less than said diameter of said substrate; and a flat annular extension connected to said circular central region so as to be disposed below said central region in a secondary plane, whereby an edge of said substrate on said circular central region overhangs said central region, wherein said annular extension provides said susceptor with an overall diameter which is greater than said diameter of said substrate on said circular central region.

2. The semiconductor wafer susceptor according to claim 1, wherein said primary and secondary planes are parallel to each other.

3. The semiconductor wafer susceptor according to claim 2, wherein said susceptor is composed of the group consisting of silicon carbide, quartz, silicon, graphite, diamond-coated graphite, or silicon-coated graphite.

4. The semiconductor wafer susceptor according to claim 3, wherein said susceptor has a net composite mechanical strength at least equal to said substrate placed on top, wherein said substrate is silicon.

5. The semiconductor wafer susceptor according to claim 2, wherein said susceptor is composed of ceramics whereby said susceptor has a net composite thermal conductivity at least equal to said substrate when said substrate is silicon.

6. The semiconductor wafer susceptor according to claim 5, wherein said susceptor has a net composite mechanical strength at least equal to said substrate placed on top, wherein said substrate is silicon.

7. The semiconductor wafer susceptor according to claim 2, wherein said susceptor is composed of composites having net composite thermal conductivity at least equal to said substrate placed on top, wherein said substrate is silicon.

8. The semiconductor wafer susceptor according to claim 7, wherein said susceptor has a net composite mechanical strength at least equal to said substrate placed on top, wherein said substrate is silicon.

9. The semiconductor wafer susceptor according to claim 2, wherein said plurality of flat annular extensions collected radiant energy for a duration of a heating phase, and convey collected energy to said circular central region.

10. The semiconductor wafer susceptor according to claim claim 2, wherein said plurality of flat annular extensions emit radiant energy for a duration of a cooling phase, and said circular central region collects and conveys a thermal energy to said extensions.

11. The semiconductor wafer susceptor according to claim claim 2, wherein a vertical extension connects said plurality of flat annular extensions and sasid circular central region.

12. The semiconductor wafer susceptor according to claim claim 2, wherein at least one of said central circular region and said annular extensions includes perforations.

13. The semiconductor wafer susceptor according to claim claim 2, wherein said circular central region has a hole resulting in a lowering of the total mass of said susceptor as compared to the mass of said susceptor without said hole.

14. The semiconductor wafer susceptor according to claim 2, wherein said circular central region is concave.

15. The semiconductor wafer susceptor according to claim 2, wherein said circular central region is convex.

16. The semiconductor wafer susceptor according to claim claim 1, wherein said susceptor has a net composite mechanical strength at least equal to said substrate placed on top, wherein said substrate is silicon.

17. A plurality of semiconductor wafer susceptors oriented to form a vertical boat for use in processing a plurality of substrates having a diameter of 200 mm or 300 mm, each of said susceptors comprising:

a flat circular central region situated in a primary plane, for supporting said substrate thereon, said circular central region having a diameter less than said diameter of said substrate; and a flat annular extension connected to said circular central region so as to be disposed below said central region in a secondary plane, whereby an edge of said substrate on said circular central region overhangs said central region, wherein said annular extension provides said susceptor with an overall diameter which is greater than said diameter of said substrate on said circular central region, and wherein said susceptor is composed of the group consisting of quartz, silicon, graphite, diamond-coated graphite, or silicon-coated graphite.

* * * * *